United States Patent

Floyd et al.

[11] Patent Number: 6,160,833
[45] Date of Patent: Dec. 12, 2000

[54] BLUE VERTICAL CAVITY SURFACE EMITTING LASER

[75] Inventors: Philip D. Floyd; Daniel Hofstetter, both of Sunnyvale, Calif.

[73] Assignee: Xerox Corporation, Stamford, Conn.

[21] Appl. No.: 09/073,707

[22] Filed: May 6, 1998

[51] Int. Cl.[7] ..................................................... H01S 3/08
[52] U.S. Cl. ............................................................... 372/96
[58] Field of Search ................................. 372/45, 43, 46, 372/96, 92; 257/94, 618

[56] References Cited

U.S. PATENT DOCUMENTS

| | | | |
|---|---|---|---|
| 5,445,107 | 8/1995 | Roth | 117/8 |
| 5,478,774 | 12/1995 | Ackley | 437/129 |
| 5,625,202 | 4/1997 | Chai | 257/94 |
| 5,656,832 | 8/1997 | Ohba | 257/190 |
| 5,798,537 | 8/1998 | Nitta | 257/103 |
| 5,821,571 | 10/1998 | Lebby | 257/98 |
| 5,834,331 | 11/1998 | Razeghi | 438/40 |
| 5,838,706 | 11/1998 | Edmond | 372/45 |
| 5,838,707 | 11/1998 | Ramdani | 372/45 |
| 5,880,485 | 3/1999 | Marx | 257/94 |
| 5,909,040 | 6/1999 | Ohba | 257/190 |
| 5,929,466 | 7/1999 | Ohba | 257/103 |
| 5,977,612 | 11/1999 | Bour | 257/618 |

OTHER PUBLICATIONS

Kapolnek et al., "Anistropic epitaxial lateral growth in GaN selective area epitaxy", *Applied Physics Letters*, vol. 71(9), Sep. 1, 1997, pp. 1204–1206.

*Primary Examiner*—Teresa M. Arroyo
*Assistant Examiner*—Gioacchino Inzirillo
*Attorney, Agent, or Firm*—William Propp

[57] ABSTRACT

The present invention provides an independently addressable, vertical cavity surface emitting laser ("VCSEL") in the blue wavelength range of 390 to 430 nanometers. The gallium nitride-based laser structure is grown by selective area epitaxy and lateral mask overgrowth. By appropriate patterning of a dielectric mask on the gallium nitride layer on a sapphire substrate, areas in a second gallium nitride layer can have a low defect density upon which the remainder of the laser structure can be formed.

6 Claims, 4 Drawing Sheets

6,160,833

BLUE VERTICAL CAVITY SURFACE EMITTING LASER

BACKGROUND OF INVENTION

This invention relates to a monolithic semiconductor laser structure and, more particularly, to an independently addressable, vertical cavity surface emitting laser ("VCSEL") in the blue wavelength range.

Monolithic solid state semiconductor lasers are very desirable light sources for high speed laser printing, optical fiber communications and other applications. Recently, there has been an increased interest in vertical cavity surface emitting lasers although edge emitting lasers are currently used in the vast majority of applications. A common laser structure is a so-called "edge emitting laser" where light is emitted from the edge of a monolithic structure of semiconductor layers. A laser structure is a "VCSEL" where the light is emitted from the surface of the monolithic structure of semiconductor layers.

A reason for the interest in VCSEL's is that edge emitting lasers produce a beam with a large angular divergence, making efficient collection of the emitted beam more difficult. On the other hand, not only does the beam of a VCSEL have a small angular divergence, a VCSEL emits light normal to the surface of the wafer.

Prior art quantum well vertical cavity surface emitting lasers can emit light in the wavelength range of about 600 to 650 nanometers (the red range) or in the range above 650 nanometers (the infrared range). However, there are important applications for laser devices that emit light in the wavelength range significantly around 400 nanometers (the blue range).

One ongoing problem with blue lasers in general is that gallium nitride and its alloys with indium and aluminum are used as the semiconductor layers in the blue laser structure. GaN itself cannot be used as a practical substrate. The problem is the lack of a suitable, lattice-matched substrate for the GaN semiconductor layers. Without a substrate with a lattice constant close to that of GaN, there will be a high density of extended defects in the nitride layers. An active layer of GaN and its alloys on a poorly lattice matched substrate will emit coherent blue light poorly and inefficiently, if at all.

The most commonly used and most readily available substrate is sapphire ($Al_2O_3$). Sapphire, however, has a similar crystal structure to GaN. An approximate epitaxial relationship between a sapphire substrate and a GaN alloy semiconductor laser structure can be obtained by matching specific crystallographic directions. However, a lattice mismatch of approximately 15 percent results from such a semiconductor structure.

It is an object of the present invention to provide an independently addressable, monolithic vertical cavity surface emitting laser structure for emitting light in the 390 to 430 nanometer range (the blue range).

It is another object of the present invention to provide a suitable lattice matched substrate for a blue VCSEL.

SUMMARY OF THE INVENTION

The present invention provides an independently addressable, vertical cavity surface emitting laser ("VCSEL") in the blue wavelength range of 390 to 430 nanometers. The gallium nitride-based laser structure is grown by selective area epitaxy and lateral mask overgrowth. By appropriate patterning of a dielectric mask on the gallium nitride layer on a sapphire substrate, areas in a second gallium nitride layer can have a low defect density upon which the remainder of the laser structure can be formed.

Other objects and attainments together with a fuller understanding of the invention will become apparent and appreciated by referring to the following description and claims taken in conjunction with the accompanying drawings.

DETAILED DESCRIPTION OF PREFERRED EMBODIMENTS

Figure 1:
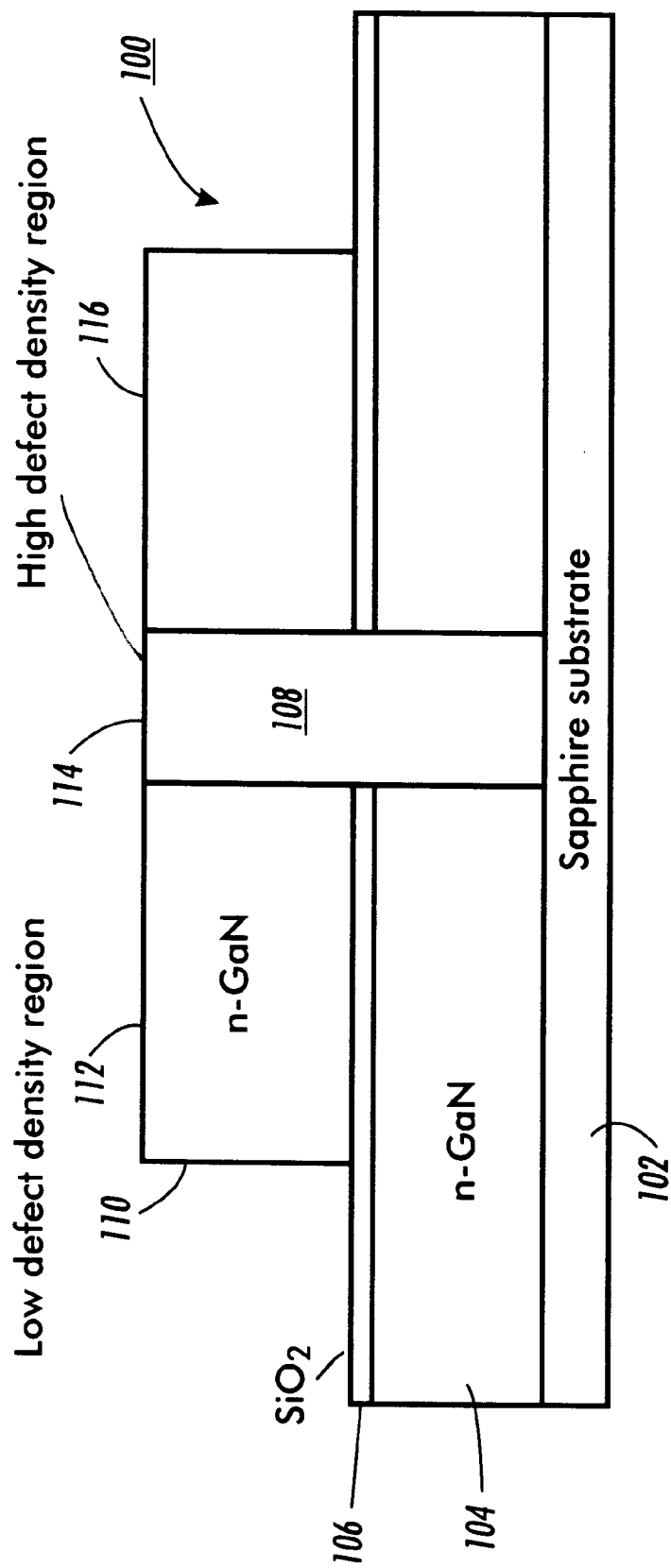
FIG. 1 is a cross-sectional side view of the semiconductor layers of the substrate and buffer layer of the semiconductor structure of the present invention.

FIG. 1 illustrates a gallium nitride (GaN) crystal structure 100 for use in a vertical cavity surface emitting laser in accordance with the present invention.

The structure 100 comprises a sapphire ($Al_2O_3$) substrate 102 upon which is first grown a n-gallium nitride (n-GaN) base layer 104 using an epitaxial deposition process known as metal-organic chemical vapor deposition ("MOCVD") as is well known in the art.

A 200 nm thick dielectric film 106 of silicon dioxide ($SiO_2$) is then deposited on the GaN base layer 104 by plasma-enhanced chemical vapor deposition ("PECVD") or by electron beam evaporation. The dielectric film 106 is then patterned by using standard photolithographic procedures and etching with hydrofluoric acid (HF).

A thin linear stripe 108 is etched down in the dielectric film 106 to expose the surface of the GaN base layer 104. A second n-gallium nitride (n-GaN) layer 110 of 4 $\mu$m thickness with a lateral width of 16 $\mu$m is then grown laterally starting at the thin exposed stripe 108. The GaN layer 110 grows laterally above the dielectric film 106 under high temperature and high ammonia flow, as described in Kapolnek et al., "Anistropic epitaxial lateral growth in GaN selective area epitaxy", *Applied Physics Letters*, vol. 71(9), Sep. 1, 1997, pp. 1204–1206, herein incorporated by reference. Growth starts selectively only in the exposed GaN area 108, but not on the top surface of the $SiO_2$ layer 106. As the layer 110 gets thicker, the layer starts to laterally overgrow the $SiO_2$ layer 106. Since this laterally overgrown material is attached to the lower GaN layer 104 only on one side, it will grow without strain and, therefore, without dislocations. The second GaN layer 110 will be laterally overgrown over the GaN base layer 104 and above the dielectric film 106 on each side of the stripe 108.

The GaN layer 110 consists of three sections: a first or end section 112 atop one portion of the dielectric film 106, a second or middle section 114 atop the exposed stripe 108 of the GaN base layer 104 and a third or end section 116 atop another portion of the dielectric film 106. The two end portions 112 and 116 since they are deposited on top of the dielectric film 106 are in the low defect density regions of the GaN layer 110. The middle section 114 since it is deposited on the other first GaN base layer 104 is in the high defect density regions of the second GaN layer 110.

The laser heterostructures will be grown by epitaxy upon one section of the lateral overgrowth of the GaN layer 110 upon the dielectric film 106 and the linear stripe 108 of the GaN base layer 104. The subsequent growth of GaN based laser heterostructures over a patterned substrate 110 leads to low defect crystal areas 112 and 116 away from the high defect crystal area 114.

The dielectric film 106 deposited on the GaN base layer 104 can, in the alternative, be silicon nitride ($SiN_x$) or silicon oxide nitride (SiON).

Figure 2:
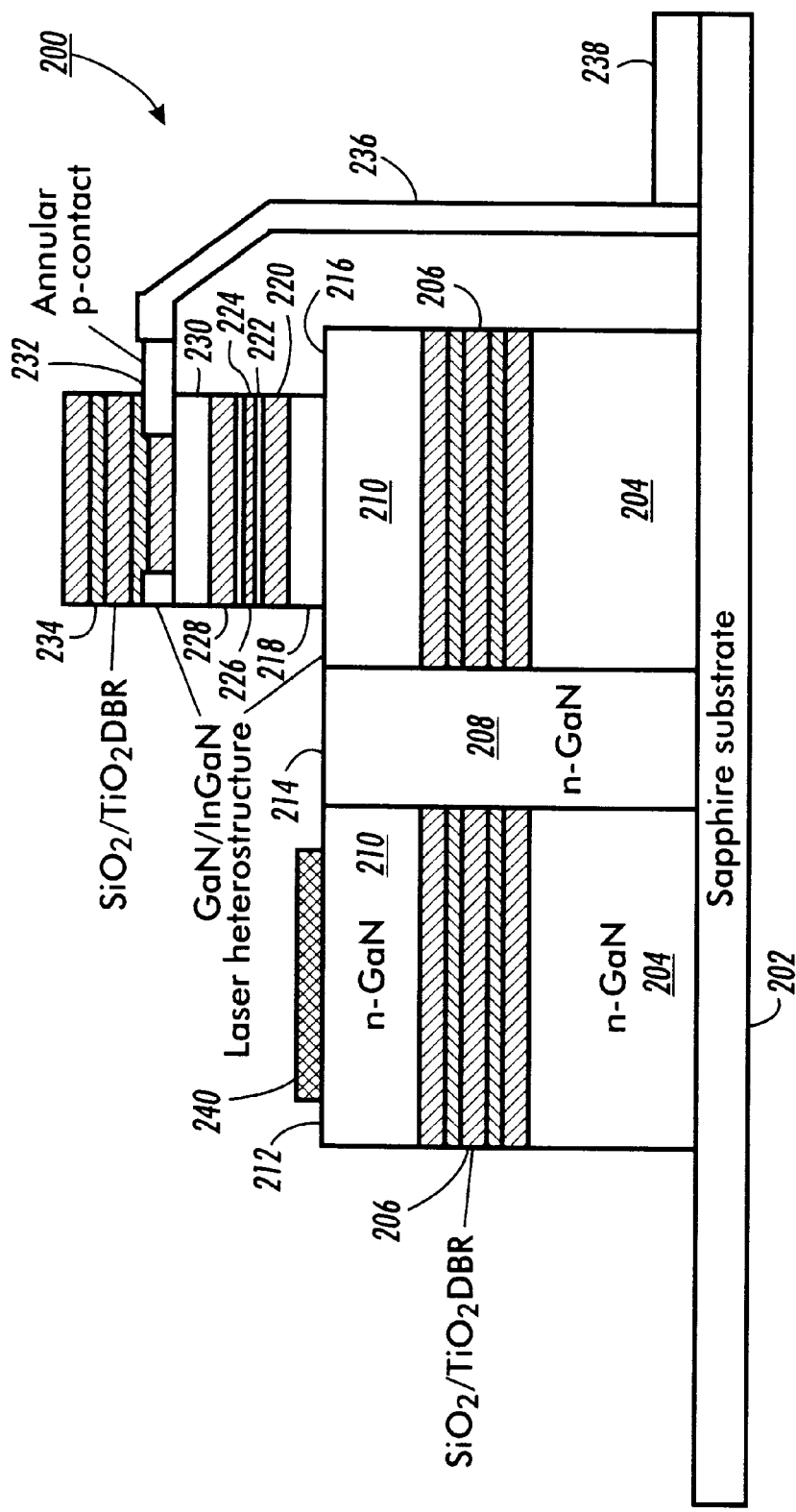
FIG. 2 is a cross-sectional side view of the semiconductor layers of the blue VCSEL semiconductor structure of the present invention.
Figure 3:
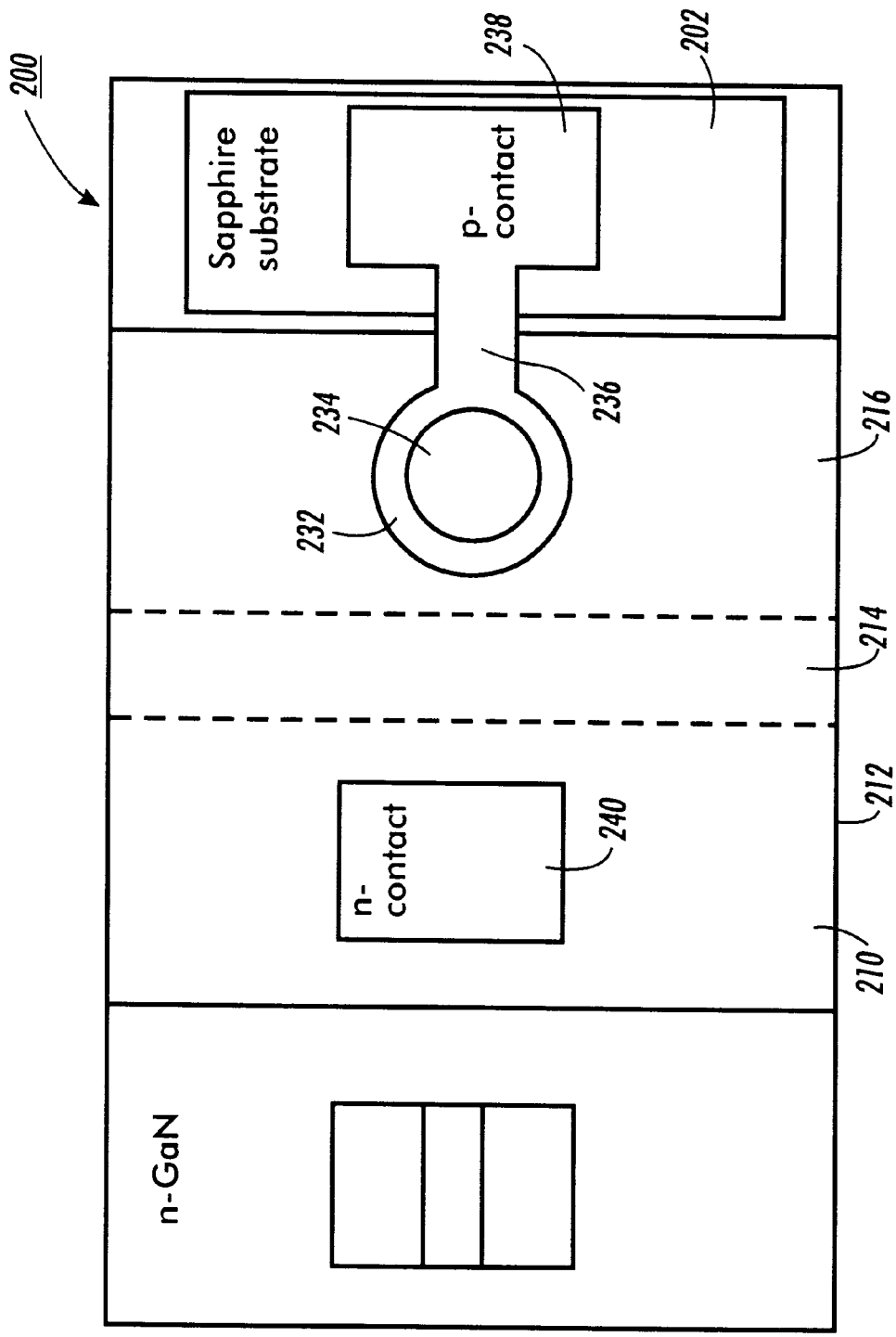
FIG. 3 is a top view of the blue VCSEL semiconductor structure of FIG. 2.

The blue vertical cavity surface emitting laser "VCSEL" semiconductor structure 200 of FIG. 2 is fabricated in accordance to the present invention.

The blue VCSEL laser structure 200 comprises a sapphire ($Al_2O_3$) substrate 202 upon which is first grown a n-gallium nitride (n-GaN) base layer 204 using an epitaxial deposition process known as metal-organic chemical vapor deposition ("MOCVD") as is well known in the art.

A narrow bandwidth distributed Bragg reflector ("DBR") 206 of approximately 8 to 12 alternating layers of dielectric film materials such as n-$SiO_2$ and n-$TiO_2$ is then deposited on the GaN base layer 204 by plasma-enhanced chemical vapor deposition ("PECVD") or by electron beam evaporation.

For example, the lower n-DBR 206 may be a 10 quarter-wave stack at the light emission wavelength in the blue spectrum for the laser structure 200. For an emission wavelength of 400 nm, the thicknesses of the n-$SiO_2$ and n-$TiO_2$ layers are a quarter of the wavelength which is nominally 69 nm in the $SiO_2$ and nominally 45 nm in the $TiO_2$. The lower DBR 206 will be approximately 1.14 microns thick.

The dielectric film DBR 206 is then patterned by using standard photolithographic procedures and etching with hydrofluoric acid (HF).

A thin linear stripe 208 is etched down in the dielectric film DBR 206 to expose the surface of the GaN base layer 204. A second n-gallium nitride (n-GaN) layer 210 of 4 $\mu$m thickness with a lateral width of 16 $\mu$m is then selectively deposited on the dielectric film DBR 206 and the thin exposed stripe 208 of the GaN base layer 204. The second GaN layer 210 will be laterally overgrown over the GaN base layer 204 and above the dielectric film 206 on each side of the stripe 208.

The GaN layer 210 consists of three sections: a first or end section 212 atop one portion of the dielectric film DBR 206, a second or middle section 214 atop the exposed stripe 208 of the GaN base layer 204 and a third or end section 216 atop another portion of the dielectric film DBR 206. The two end portions 212 and 216 since they are deposited on top of the dielectric film 206 are in the low defect density regions of the GaN layer 210. The middle section 214 since it is deposited on the GaN base layer 204 is in the high defect density regions of the second GaN layer 210.

The laser heterostructure is then deposited on the GaN layer 210.

Using Organometallic Vapor Phase Epitaxy ("OMPVE"), a lower n-$Al_{0.08}Ga_{0.92}N$ aluminum gallium nitride cladding layer 218 is deposited on the GaN layer 210. The n-$Al_{0.08}Ga_{0.92}N$ aluminum gallium nitride cladding layer 218 has a thickness of 0.5 $\mu$m and is silicon doped to a concentration of $5\times10^{17}$ cm$^{-3}$. A first lower n-GaN confinement layer 220 is deposited upon the lower cladding layer 218. The n-GaN confinement layer 220 has a thickness of 100 nanometers and is silicon doped to a concentration of $10^{18}$ cm$^{-3}$. An $In_{0.15}Ga_{0.85}N$/GaN multiple quantum well active layer 222 is deposited on the confinement layer 220. The $In_{0.15}Ga_{0.85}N$/GaN multiple quantum well active layer 222 is undoped and has a thickness of 120 nm. A second upper p-GaN confinement layer 224 is deposited upon the multiple quantum well active layer 222. The p-GaN confinement layer 224 has a thickness of 100 nanometers and is magnesium doped to a concentration of $10^{18}$ cm$^{-3}$. An upper p-$Al_{0.08}Ga_{0.92}N$ aluminum gallium nitride cladding layer 226 is deposited on the confinement layer 224. The p-$Al_{0.08}Ga_{0.92}N$ aluminum gallium nitride cladding layer 226 has a thickness of 0.5 $\mu$m and is magnesium doped to a concentration of $5\times10^{17}$ $cm^{-3}$. A third p-GaN contact layer 228 is deposited on the upper cladding layer 226. The contract layer 228 has a thickness of 120 nanometers and is magnesium doped to a concentration of $5\times10^{17 cm-3}$.

The multiple quantum well layer 222 forms the active region for emission of light in the blue wavelengths of 390 to 430 nanometers.

The laser heterostructure 200 is formed of gallium nitride semiconductor layers and its alloys with aluminum and/or indium.

Dry etching of the laser structure 200 will remove portions of epitaxial layers above the first section 212 above the dielectric film 206 and the second section 214 above the GaN layer 210, leaving a mesa laser structure 230 above the third section 216 above the dielectric film 206. Although not required, a small portion (not shown) of the second section 214 may remain attached to the side of the mesa to provide insulation and isolation. Additionally, this etching step can be used to remove any polycrystalline material that may collect on the dielectric mask during AlGaN growth.

The two end portions 212 and 216 since they are deposited on top of the dielectric film 206 are in the low defect density regions of the GaN layer 210. Accordingly, alternately (not shown), the mesa laser structure could be etched atop the first section 212.

An annular p-contact 232 of Cr-Au or Ti-Pt-Au is formed by metal evaporation on the contact layer 228. Alternately, an InGaN contact layer (not shown) can be deposited on the contact layer 228 first, followed by the formation of the p-contact 232.

Within the annular contact 232, the upper p-DBR 234 is formed on the surface of the contact layer 228.

The narrow bandwidth distributed Bragg reflector ("DBR") 234 consists of approximately 8 to 12 alternating layers of dielectric film materials such as n-$SiO_2$ and n-$TiO_2$ which are deposited on the GaN contact layer 228 by plasma-enhanced chemical vapor deposition ("PECVD") or by electron beam evaporation.

For example, the upper p-DBR 234 may be a 10 quarter-wave stack at the light emission wavelength in the blue spectrum for the laser structure 230. The thicknesses of the n-$SiO_2$ and n-$TiO_2$ layers are a quarter of the wavelength which is nominally 69 nm in the $SiO_2$ and nominally 45 nm in the $TiO_2$. The upper DBR 234 will be approximately 1.14 microns thick.

An air-bridge 236 of Cr-Au or Ti-Pt-Au connects the annular p-contact 232 to a much larger contact pad 238 on the surface of the sapphire substrate 202.

A n-contact 240 of Cr-Au or Ti-Pt-Au is formed by metal evaporation on the first or end section 212 of the GaN layer 210.

The vertical nature of the laser structure 230 upon the third section 216 of the GaN layer 210 provides lateral optical and electrical confinement in the laser.

Current will flow through conventional electrodes from the p-contact 232 through the contact layer 228, through the upper cladding layer 226, through the confinement layer 224, through the multiple quantum well active layer 222 to forward bias the layer to emit light in the blue wavelengths, through the confinement layer 220, through the cladding layer 218, through the third section 216 of the GaN layer 210, through the second section 214 of the GaN layer 210, and through the first section 212 of the GaN Layer 210 to the n-contact 240.

The active region will emit light through the surface of the laser structure 230 through either the lower DBR 206 or through the upper DBR 236.

Alternately, the dielectric film materials used in the DBRs can be alternating layers of SiN and $SiO_2$ or other suitable dielectric materials.

Figure 4:
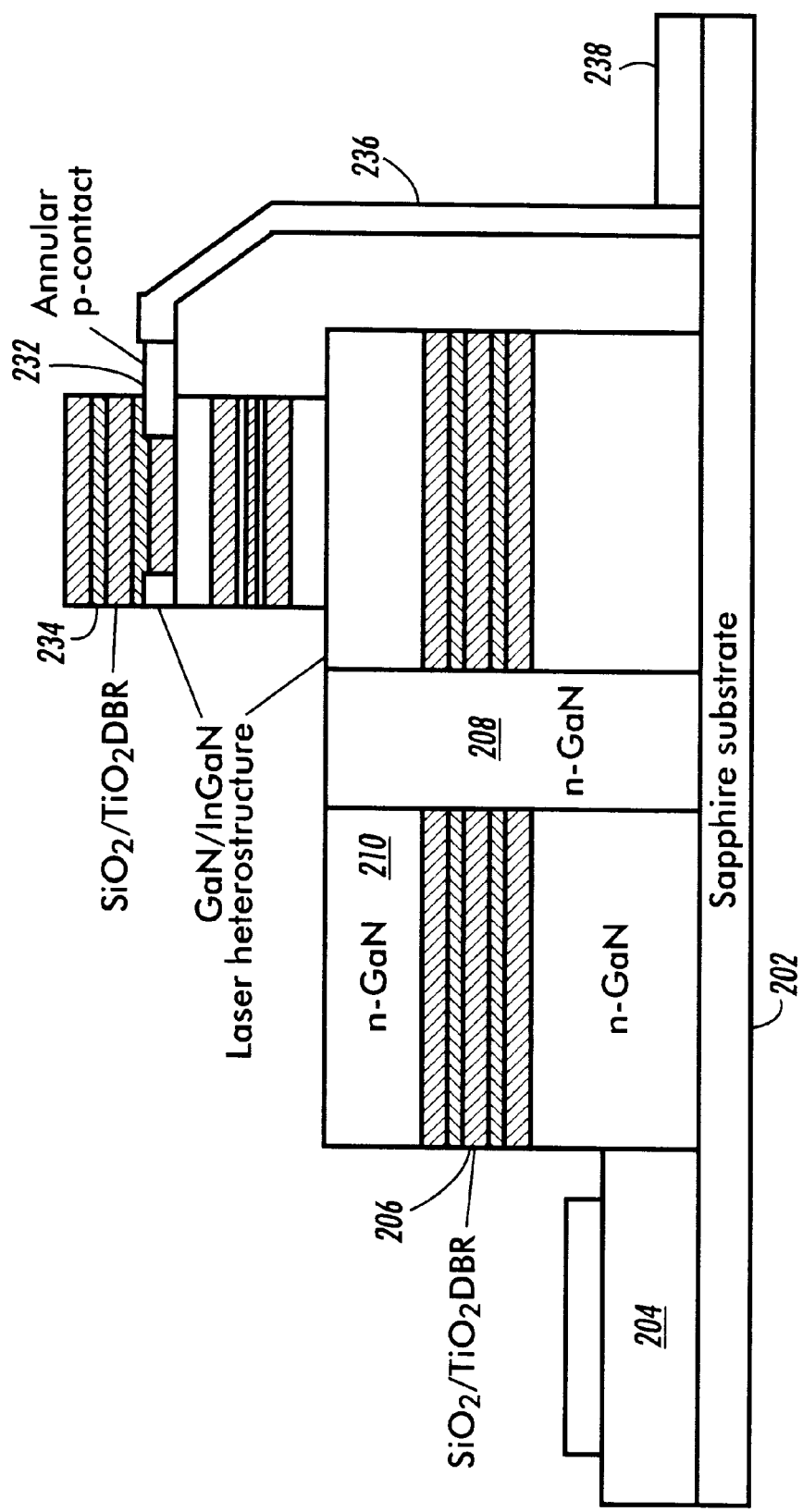
FIG. 4 is a cross-sectional side view of the blue VCSEL semiconductor structure of FIG. 2 with an alternate contact position.

Alternately, as shown in FIG. 4, the n-contact 340 can be formed on the surface of the GaN base layer 204. The current path will go through the p-contact 232 through the contact layer 228, through the upper cladding layer 226, through the confinement layer 224, through the multiple quantum well active layer 222 to forward bias the layer to emit light in the blue wavelengths, through the confinement layer 220, through the cladding layer 218, through the third section 216 of the GaN layer 210, through the second section 214 of the GaN layer 210, and through the base layer 204 to the n-contact 340.

Alternately, to bridge the metal contacts down without an air bridge, an insulating dielectric and conformational metallization can be used to connect large contacts on the substrate to the smaller contacts on the laser structure. Similarly, proton implantation or conformal metal evaporation may be used for the contacts.

While the invention has been described in conjunction with specific embodiments, it is evident to those skilled in the art that many alternatives, modifications, and variations will be apparent in light of the foregoing description. Accordingly, the invention is intended to embrace all such alternatives, modifications, and variations that fall within the spirit and scope of the appended claims.

What is claimed is:

1. A surface emitting laser for emitting coherent light in wavelength range of 390 to 430 nanometers comprising:

a sapphire substrate;

a first gallium nitride semiconductor layer formed on said sapphire substrate; said first gallium nitride semiconductor layer having a first region, a second region and a third region;

a first reflector of dielectric materials formed on said first region of said first gallium nitride semiconductor layer;

a second reflector of dielectric materials formed on said third region of said first gallium nitride semiconductor layer;

a second gallium nitride semiconductor layer formed on said first reflector, said second reflector and said second region of said first gallium nitride semiconductor layer; said second gallium nitride semiconductor layer formed on said first reflector having a low defect density, said second gallium nitride semiconductor layer formed on said second reflector having a low defect density and said second gallium nitride semiconductor layer formed on said first gallium nitride semiconductor layer having a high defect density; said second gallium nitride semiconductor layer formed on said second region of said first gallium nitride semiconductor layer being between said second gallium nitride semiconductor layer formed on said first reflector and said second gallium nitride semiconductor layer formed on said second reflector;

a plurality of semiconductor layers formed on said second gallium nitride semiconductor layer formed on said first reflector;

one or more of said plurality of semiconductor layers forming an active region;

a third reflector of dielectric materials formed on said plurality of semiconductor layers, at least one of said first or third reflectors allowing a partial transmission of light emitted by said active region; and a first electrode and a second electrode which enable biasing of said active region to emit coherent light in wavelength range of 390 to 430 nanometers.

2. The surface emitting laser of claim 1 wherein said plurality of semiconductor layers are gallium nitride or its alloys with indium and aluminum.

3. The surface emitting laser of claim 1 wherein said first reflector said second reflector and said third reflector are distributed Bragg reflectors.

4. The surface emitting laser of claim 1 wherein said first electrode is formed on a portion of said plurality of semiconductor layers.

5. The surface emitting laser of claim 1 wherein said second electrode is formed on said second gallium nitride semiconductor layer.

6. The surface emitting laser of claim 1 wherein said second electrode is formed on said first gallium nitride semiconductor layer.

* * * * *